United States Patent
Barkley

(10) Patent No.: US 7,974,146 B2
(45) Date of Patent: Jul. 5, 2011

(54) WORDLINE TEMPERATURE COMPENSATION

(75) Inventor: Gerald J Barkley, Oregon, WI (US)

(73) Assignee: Micron Technology, Inc., Boise, ID (US)

( * ) Notice: Subject to any disclaimer, the term of this patent is extended or adjusted under 35 U.S.C. 154(b) by 362 days.

(21) Appl. No.: 12/339,935

(22) Filed: Dec. 19, 2008

(65) Prior Publication Data

US 2010/0157672 A1 Jun. 24, 2010

(51) Int. Cl.
*G11C 8/00* (2006.01)

(52) U.S. Cl. .................... 365/230.06; 365/211

(58) Field of Classification Search ............. 365/230.06, 365/211, 189.05, 230.08, 240
See application file for complete search history.

(56) References Cited

U.S. PATENT DOCUMENTS 7,277,355 B2 * 10/2007 Tanzawa .................. 365/230.06
2003/0227792 A1 * 12/2003 Marr ............................ 365/154
* cited by examiner

*Primary Examiner* — Son T Dinh
(74) *Attorney, Agent, or Firm* — Dana B. LeMoine; LeMoine Patent Services, PLLC

(57) ABSTRACT

A nonvolatile memory includes a temperature dependent read window. One or more temperature compensated wordline voltage supply circuits provide temperature compensated wordline signal(s) to the nonvolatile memory. The temperature compensated wordline signals change as the temperature dependent read window changes.

12 Claims, 9 Drawing Sheets

WORDLINE TEMPERATURE COMPENSATION

FIELD

The present invention relates generally to memory devices, and more specifically to memory devices that compensate for temperature variations.

BACKGROUND

Memory devices may store digital information as programmable transistor threshold voltages. The transistor threshold voltages may change with changes in temperature, possibly resulting in read errors. Compensating for temperature variations in memory devices can reduce read errors.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
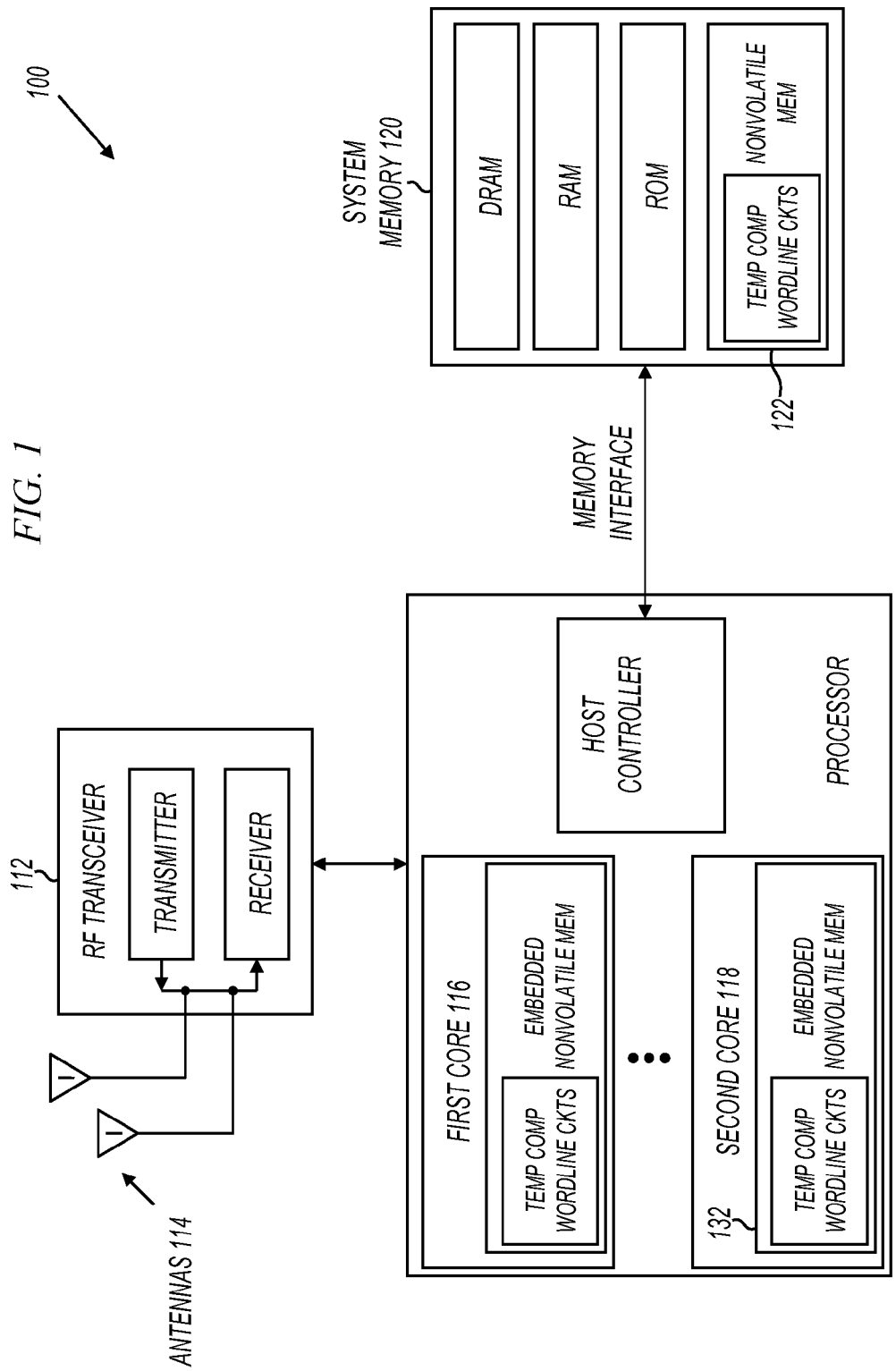
FIG. 1 illustrates a wireless architecture that incorporates a nonvolatile memory in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DESCRIPTION OF EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them)

physical or electrical contact with each other, and/or that the two or more elements co-operate or interact with each other (e.g. as in a cause an effect relationship).

The wireless architecture embodiment illustrated in FIG. 1 shows a communications device 100 that includes nonvolatile memory with temperature compensated wordline circuits in accordance with the present invention. It should be noted that the present invention is not limited to wireless communication embodiments and other, non-wireless applications may use the present invention. As shown in this wireless embodiment, communications device 100 includes one or more antenna structures 114 to allow radios to communicate with other over-the-air communication devices. As such, communications device 100 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems collocated in the same platform of communications device 100 provide the capability of communicating with different frequency bands in an RF/location space with other devices in a network. It should be understood that the scope of the present invention is not limited by the types of, the number of, or the frequency of the communication protocols that may be used by communications device 100.

The embodiment illustrates the coupling of antenna structure 114 to a transceiver 112 to accommodate modulation/demodulation. In general, analog front end transceiver 112 may be a stand-alone Radio Frequency (RF) discrete or integrated analog circuit, or transceiver 112 may be embedded with a processor having one or more processor cores 116 and 118. The multiple cores allow processing workloads to be shared across the cores and handle baseband functions and application functions. An interface may be used to provide communication or information between the processor and the memory storage in a system memory 120. Although the scope of the present invention is not limited in this respect, the interface may comprise serial and/or parallel buses to share information along with control signal lines to be used to provide handshaking between the processor and system memory 120.

The system memory 120 may optionally be used to store instructions that are executed by the processor during the operation of wireless communication device 100, and may be used to store user data such as the conditions for when a message is to be transmitted by wireless communication device 100 or the actual data to be transmitted. For example, the instructions stored in system memory 120 may be used to perform wireless communications, provide security functionality for communication device 100, user functionality such as calendaring, email, internet browsing, etc.

System memory 120 may be provided by one or more different types of memory and may include both volatile and a nonvolatile memory 122 having temperature compensated wordline voltage supply circuits. The volatile and nonvolatile memories may be combined in a stacking process to reduce the footprint on a board, packaged separately, or placed in a multi-chip package with the memory component placed on top of the processor. The embodiment also illustrates that one or more of the processor cores may be embedded with nonvolatile memory 132.

Figure 2:
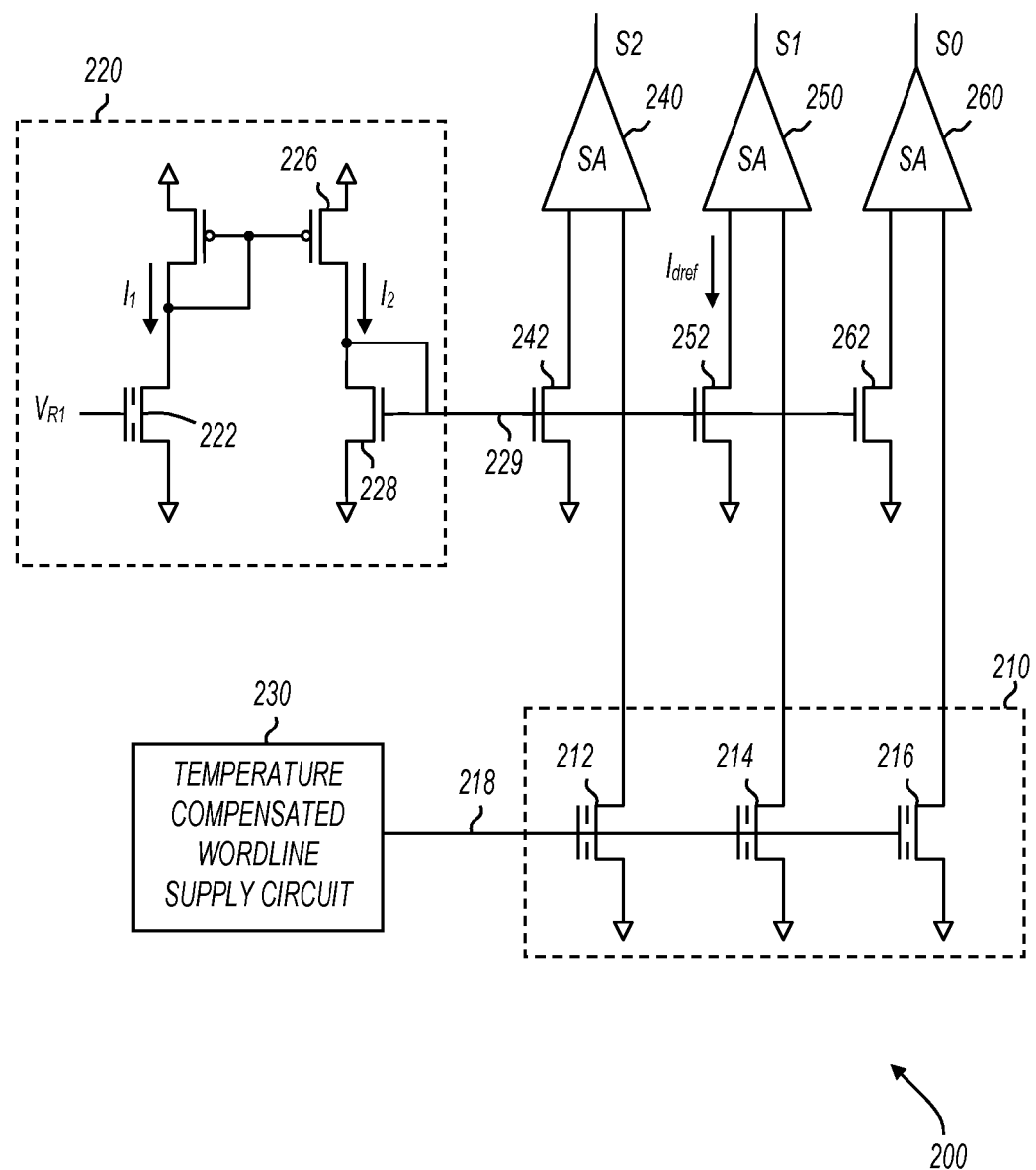
FIG. 2 shows a diagram of a nonvolatile memory that includes a temperature compensated wordline voltage supply circuit in accordance with some embodiments.

FIG. 2 shows a diagram of a nonvolatile memory that includes a temperature compensated wordline voltage supply circuit. Memory device 200 includes memory array 210, reference current generator 220, temperature compensated wordline voltage supply circuit 230, sense amplifiers 240, 250, and 260, and current mirror transistors 242, 252, and 262.

Memory array 210 is shown including transistors 212, 214, and 216 having gate nodes coupled to wordline 218. Transistors 212, 214, and 216 are transistors capable of storing information by being "programmed" to have different threshold voltages $V_T$. For example, each of transistors 212, 214, and 216 may be "FLASH" cells that have floating gates capable of storing charge. The threshold voltage of a programmed transistor depends in part on the amount of charge stored on the floating gate. By varying the amount of charged stored, transistors 212, 214, and 216 may be programmed to one of two different levels.

For simplicity, FIG. 2 shows one row of cells in the array 210. In some embodiments, the array includes many rows and columns of cells. Further, in some embodiments, arrays are arranged in blocks, and many blocks are included within memory device 200. Memory device 200 may be any size with any hierarchical arrangement without departing from the scope of the present invention.

Sense amplifiers 240, 250, and 260 are used to compare currents in array cells to the reference current. For example, sense amplifier 240 compares a drain current in transistor 212 to a drain current in transistor 242. The output of the sense amplifier is a digital signal representing the result of the comparison. As shown in FIG. 2, multiple sense amplifiers are included, where each sense amplifier is connected to a unique bitline. This allows many cells to be read simultaneously to increase the data throughput. All cells being read simultaneously receive a common gate voltage applied through the wordline.

Reference current generator 220 includes reference cell 222, which in some embodiments, is identical to array cells. For example, reference cell 222 may be identical to cell transistors 212, 214, and 216. The threshold voltage values of reference cell 222 are adjusted during manufacturing or testing to achieve the desired nominal reference current. In some embodiments, a separate reference current generator 220 is provided for each sense amplifier. In embodiments represented by FIG. 2, a current mirror is used to propagate the current of a single reference cell to each of the sense amplifiers. For example, the current in reference cell 222 ($I_1$) is mirrored to transistors 226 and 228 as $I_2$, which is in turn mirrored to transistors 242, 252, and 262 as $I_{dref}$. Transistor scaling techniques may be employed to provide fixed relationships between currents $I_1$, $I_2$, and $I_{dref}$.

The threshold voltage of cell transistors 212, 214, and 216 are temperature dependent. For example, when programmed, the threshold voltage of transistor 212 may vary as a function of temperature. Various embodiments of the present invention generate a temperature compensated wordline read voltage on wordline 218 to compensate for the temperature dependent threshold voltage variations in the memory cell transistors. Temperature compensated wordline voltage supply circuit 230 generates the temperature compensated wordline voltage. Various embodiments of temperature compensated wordline voltage supply circuits are described more fully below with respect to later figures.

Figure 3:
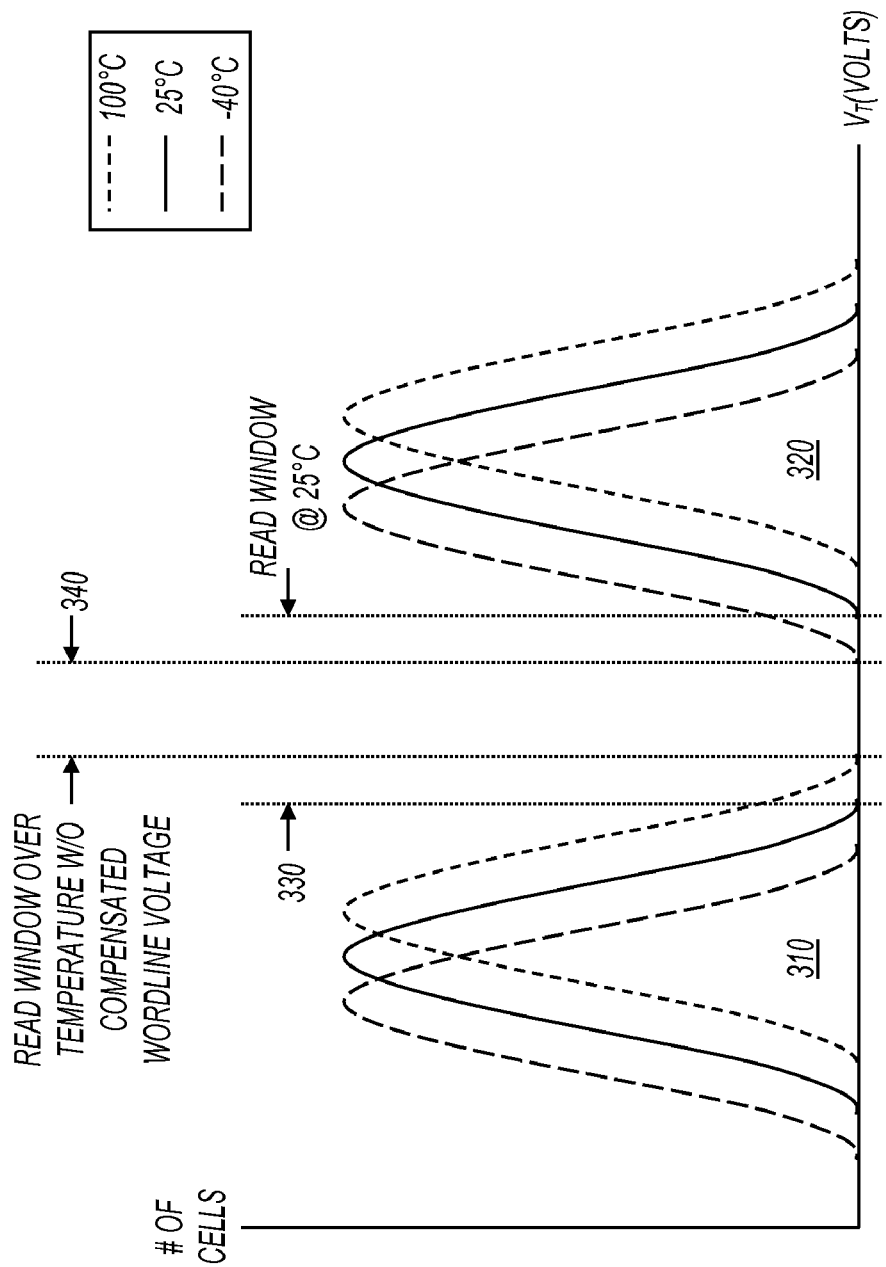
FIG. 3 shows a graph illustrating a read window temperature dependence of the nonvolatile memory of FIG. 2.

FIG. 3 shows a graph illustrating a read window temperature dependence of the nonvolatile memory of FIG. 2. As described above with reference to FIG. 2, each memory cell transistor stores information as charge on a floating gate. The resulting threshold voltages of the transistors can be represented by a bi-modal distribution as shown in FIG. 3. Memory cells in a low $V_T$ state have threshold voltages within a first range 310 and memory cells in a high $V_T$ state have threshold voltages within a second range 320. During a read operation, a wordline voltage between range 310 and 320 is presented. Based on the resulting drain current, a cell is determined to be in one range or the other.

The "read window" defines a range of wordline voltages that can be used to distinguish between the two $V_T$ ranges. For example, read window 330 shows wordline voltages capable of distinguishing between the $V_T$ distributions at 25 degrees Centigrade.

FIG. 3. also shows how the $V_T$ distributions can shift over temperature. When the temperature rises, the distributions shift to the right because threshold voltages increase. When the temperature drops, the distributions shift to the left because the threshold voltages decrease. As shown at 340, the read window shrinks if the memory is to be operated over a wide temperature range.

Various embodiments of the present invention provide a temperature compensated wordline voltage supply circuit, such that the wordline voltage used for read operations changes as a function of temperature similar to the way in which the $V_T$ distributions change as a function of temperature. Examples of temperature compensated wordline voltage supply circuits are shown in FIGS. 4 and 5.

Figure 4:
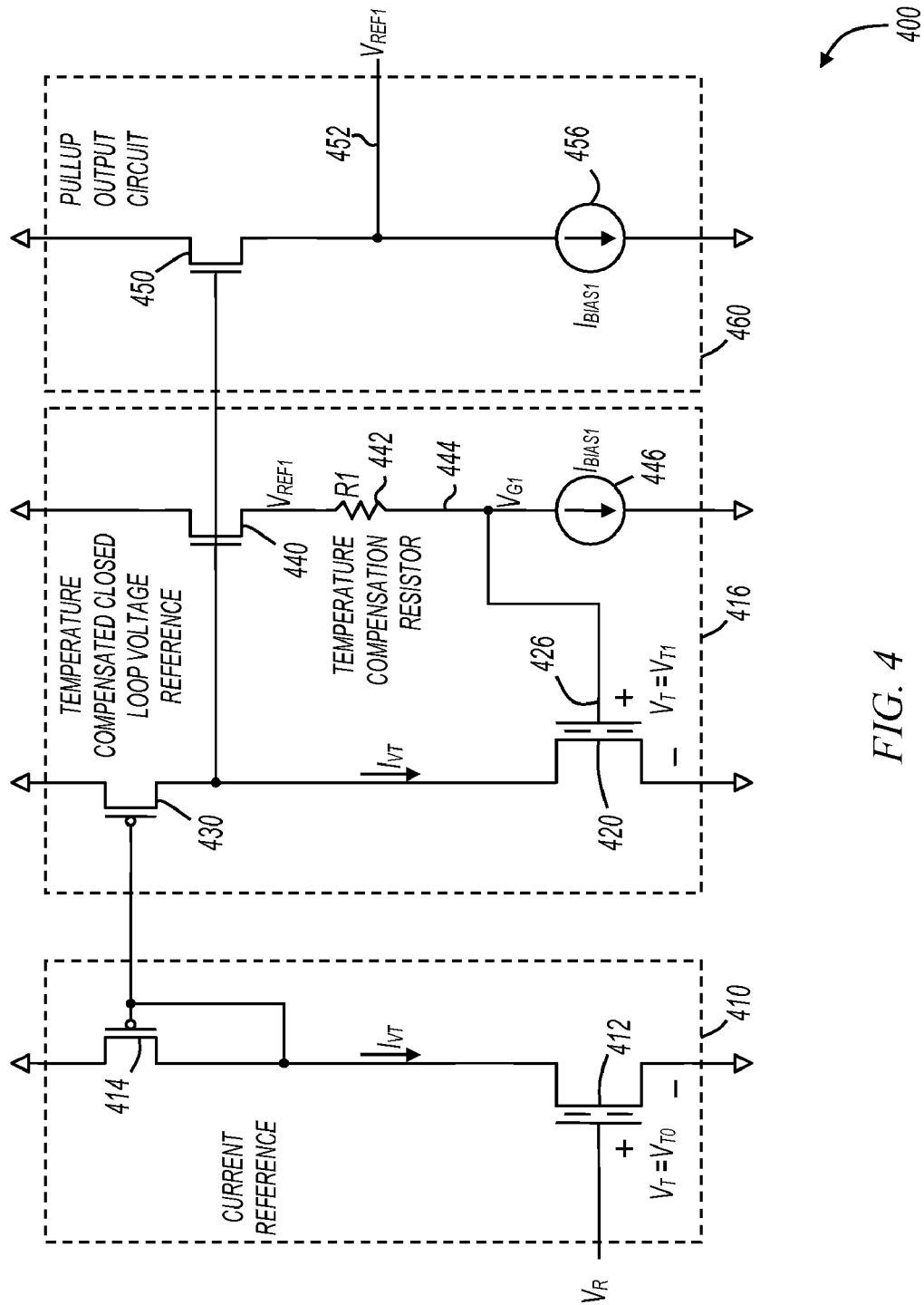
FIG. 4 shows a temperature compensated wordline voltage supply circuit having a pull-up output circuit.
Figure 5:
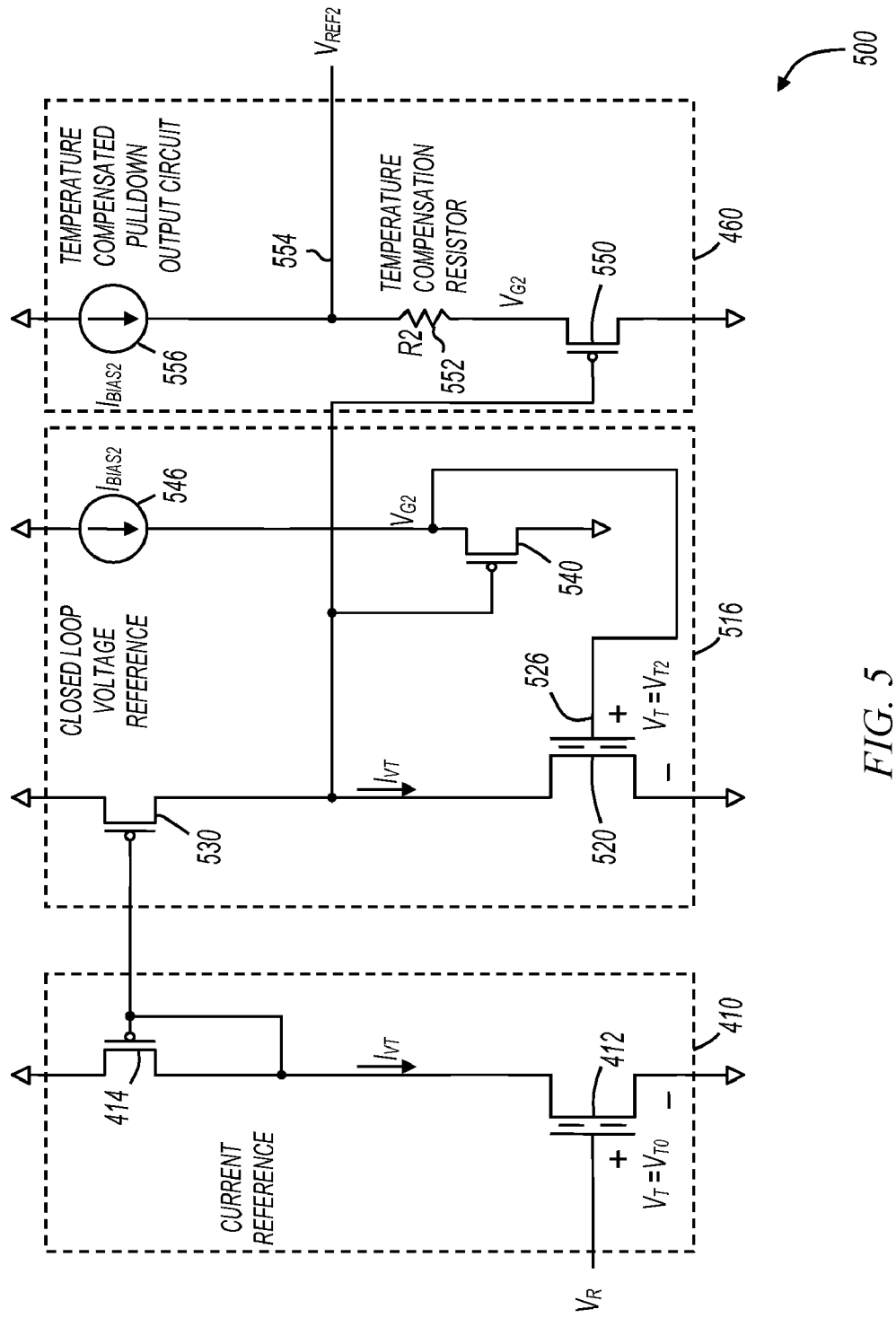
FIG. 5 shows a temperature compensated wordline voltage supply circuit having a pull-down output circuit.

FIG. 4 shows a temperature compensated wordline voltage supply circuit having a pull-up output circuit. Voltage supply circuit 500 includes current reference circuit 410, temperature compensated closed loop voltage reference 416, and pull-up output circuit 460. In operation, closed loop voltage reference 416 generates a temperature compensated reference voltage, and output circuit 460 provides and output voltage $V_{REF1}$ matching the reference voltage with an open loop response at node 452.

Closed loop voltage reference circuit 416 is a "trimmable" voltage reference circuit that also includes temperature compensation. For example, voltage reference circuit 416 includes a floating gate transistor 420 having a programmable threshold voltage that when programmed "trims" the reference voltage $V_{REF1}$. The floating gate transistor is used as reference device, in that the output voltage generated by the voltage supply circuit is a function of the programmed threshold voltage. Further, resistor 442 exhibits a change in resistance as a function of temperature, and this causes $V_{REF1}$ to change as a function of temperature also.

Current reference circuit 410 includes flash cell 412 and transistor 414. Flash cell 412 is programmed to have a threshold voltage of $V_{T0}$. In operation, the gate of flash cell 412 receives a reference voltage $V_R$. $V_R$ may be set to be substantially equal to $V_{T0}$, thereby causing a drain current equal to the "threshold voltage current" $I_{VT}$ to flow in flash cell 412. As used herein, the term "threshold voltage current" refers to the current that flows through a transistor when a voltage of substantially $V_T$ appears across the control terminals of the transistor, and the drain voltage is set to a nominal value. For example, the threshold voltage current of an NMOS transistor is equal to the drain-to-source current of the transistor when the gate-to-source voltage is substantially $V_T$. Also for example, the threshold voltage current ($I_{VT}$) of flash cell 412 flows from drain to source when the gate-to-source voltage on flash cell 412 is substantially $V_{T0}$.

Voltage reference circuit 416 includes flash cell 420, current source 446, transistors 430 and 440, and temperature compensation resistor 442. Flash cell 420 is an example of a floating gate transistor having a variable threshold voltage ($V_{T1}$). The threshold voltage of flash cell 420 may be modified by changing the amount of charge stored on the floating gate of flash cell 420. This may also be referred to as "programming" flash cell 420. Flash cell 420 may be programmed with programming circuitry (not shown) useful for programming floating gate transistors.

Transistor 430 is a current mirror transistor that mirrors the current ($I_{VT}$) in transistor 414. This current flows in the drain of flash cell 420. Flash cells 412 and 420 are matched, and therefore the drain current ($I_{VT}$) is substantially equal to the threshold voltage current of flash cell 420. The operation of the feedback loop within voltage reference 416 in combination with current $I_{VT}$ forces the gate-to-source voltage of flash cell 420 to be substantially $V_{T1}$, which may vary based on how flash cell 420 has been programmed. In general, the gate voltage of flash cell 420 is given by:

$$V_{G1}=V_R+V_{T1}-V_{T0}$$

Where $V_R$ is the reference voltage applied to the gate of flash cell 412, $V_{T0}$ is the programmed threshold voltage of flash cell 412, and $V_{T1}$ is the programmed threshold voltage of flash cell 420. When $V_R$ is equal to $V_{T0}$ as described above, this simplifies to:

$$V_{G1}=V_{T1}$$

A reference voltage, $V_{REF1}$, is generated at the node between resistor 442 and transistor 440 as:

$$V_{REF1}=V_{G1}+I_{BIAS}*R1$$

When $V_R$ is equal to $V_{T0}$ as described above, this simplifies to:

$$V_{REF1}=V_{T1}+I_{BIAS1}*R1$$

Transistor 440 is coupled as a "source follower," which provides low output impedance to drive relatively large capacitive loads easily. The gate node of transistor 440 is coupled to the drain node of transistor 430 to receive a voltage that is influenced by flash cell 420. The drain node of transistor 440 is coupled to a power supply node, and the source node of transistor 440 is coupled to temperature compensation resistor 442. In some embodiments, source follower transistor 440 is operated in the sub-threshold region where the transconductance ($g_m$) of the transistor is proportional to the drain current. This operation is in contrast to operation in the inversion saturation region where $g_m$ is proportional to the square-root of the drain current. In other words, in the sub-threshold region of operation, the value of $g_m$ is higher for a given drain current. The output impedance of the source follower stage is equal to $1/g_m$ of transistor 440, and may be adjusted by choosing the size of source follower transistor 440 and the drain current provided by current source 446.

In some embodiments, flash cell 420 is programmed to perform offset voltage correction. Voltage offsets of the various circuit components may be trimmed out of the circuit by modifying the threshold voltage of flash cell 420 until the desired output voltage is obtained.

In some embodiments, flash cells 412 and 420 are manufactured with dimensions larger than the minimum dimensions available in a particular manufacturing process. For example, the width of the gate area, the length of the gate area, or both, may be larger than the minimum dimension available. In some embodiments, the gate area of flash cell 420 is a few times larger than the minimum area possible. In other embodiments, the gate area of flash cell 420 is over one hundred times larger than the minimum area possible. In still further embodiments, the gate area of flash cell 420 is over one thousand times larger than the minimum gate area. A larger gate area may provide greater $V_T$ stability over time, in part because a larger amount of charge may be stored on a larger floating gate within the flash cells.

Pull up output circuit 460 includes transistors 450 and current source 456. Transistor 450 is an open loop source-follower transistor that receives the same gate voltage as source-follower transistor 440. Transistor 450 is not part of the feedback loop like transistor 440, and is free to respond more rapidly to voltage changes. The source node of transistor 450 is coupled to provide the reference voltage $V_{REF1}$ on node 452 at the junction between current source 456 and source-follower transistor 450.

N-channel source-followers may be advantageously used to pull up the output node much faster when the initial voltage is lower than the nominal voltage. With the gate voltage fixed, the initial source-to-gate voltage of the source follower transistor will be higher than its nominal value and it can pull up the output voltage very strongly to the nominal value.

In some embodiments, current sources 446 and 456 are designed to source the same current value ($I_{BIAS1}$). Also in some embodiments, transistors 440 and 450 are matched devices that exhibit substantially the same operating characteristics. In embodiments represented by FIG. 4, transistors 440 and 450 are driven by a common gate voltage. In these embodiments, if transistors 440 and 450 are matched, and the two load currents provided by current sources 446 and 456 are matched, the output voltage $V_{REF1}$ will be substantially equal to the threshold voltage $V_{T1}$ of flash cell 420 plus the voltage drop across the temperature compensation resistor. With the gate voltage of transistor 450 held fixed by the closed loop configuration, transistor 450 may respond very fast and may be able to pull up any voltage on output node 452 to the $V_{REF1}$ voltage value without disrupting the operation of the feedback loop.

Temperature compensation resistor 442 may be implemented in any manner that provides a nonzero temperature coefficient. For example, in some embodiments, resistor 442 is an N-well transistor fabricated on a semiconductor die. In some embodiments, temperature compensation resistor 442 has a positive temperature coefficient, meaning that the resistance value R1 increases as the temperature increases. Since $V_{REF1}$ is positively biased by $I_{BIAS1}$*R1, the output voltage $V_{REF1}$ also increases as the temperature increases. The value of R1 and $I_{BIAS1}$ are chosen such that the increase in $V_{REF1}$ as a function of temperature closely follows the increase in $V_T$ of memory cells (see FIG. 3) as a function of temperature. When values for R1 and $I_{BIAS1}$ are carefully chosen, the size of the read window can be preserved over temperature.

FIG. 5 shows a temperature compensated wordline voltage supply circuit having a pull-down output circuit. Voltage supply circuit 500 includes current reference circuit 410, closed loop voltage reference 516, and temperature compensated pull-up output circuit 560. Voltage supply circuit 500 is similar to voltage supply circuit 400 (FIG. 4) except that the temperature compensation is included in the output circuit rather than the voltage reference circuit, and the source follower transistors 540 and 550 are p-channel devices instead of n-channel devices.

Current reference circuit 410 is the same as that shown in FIG. 4. Flash cell 412 is programmed to have a threshold voltage of $V_{T0}$, and the gate of flash cell 412 is driven with a reference voltage $V_R$ to produce a drain current of $I_{VT}$.

Voltage reference circuit 516 includes flash cell 520, current source 546, and transistors 530 and 540. Flash cell 520 is an example of a floating gate transistor having a variable threshold voltage ($V_{T2}$). The threshold voltage of flash cell 520 may be modified by changing the amount of charge stored on the floating gate of flash cell 520. This may also be referred to as "programming" flash cell 520. Flash cell 520 may be programmed with programming circuitry (not shown) useful for programming floating gate transistors.

Transistor 530 is a current mirror transistor that mirrors the current ($I_{VT}$) in transistor 414. This current flows in the drain of flash cell 520. Flash cells 412 and 520 are matched, and therefore the drain current ($I_{VT}$) is substantially equal to the threshold voltage current of flash cell 520. The operation of the feedback loop within voltage reference 516 in combination with current $I_{VT}$ forces the gate-to-source voltage of flash cell 520 to be substantially $V_{T2}$, which may vary based on how flash cell 520 has been programmed. In general, the gate voltage of flash cell 520 is given by:

$$V_{G2}=V_R+V_{T2}-V_{T0}$$

Where $V_R$ is the reference voltage applied to the gate of flash cell 412, $V_{T0}$ is the programmed threshold voltage of flash cell 412, and $V_{T2}$ is the programmed threshold voltage of flash cell 520. When $V_R$ is equal to $V_{T0}$ as described above, this simplifies to:

$$V_{G2}=V_{T2}$$

Transistor 540 is coupled as a "source follower," which provides low output impedance to drive relatively large capacitive loads easily. The gate node of transistor 540 is coupled to the drain node of transistor 530 to receive a voltage that is influenced by flash cell 520. The drain node of transistor 540 is coupled to a power supply node (which may be "ground"), and the source node of transistor 540 is coupled to current source 546. Similar to transistor 440 (FIG. 4), transistor 540 may be operated in the sub-threshold region where the transconductance ($g_m$) of the transistor is proportional to the drain current.

Temperature compensated pull-down output circuit 560 includes transistor 550, temperature compensation resistor 552, and current source 556. Transistor 550 is an open loop source-follower transistor that receives the same gate voltage as source-follower transistor 540. Transistor 550 is not part of the feedback loop like transistor 540, and is free to respond more rapidly to voltage changes. The source node of transistor 550 has voltage $V_{G2}$ because it receives the same gate voltage and drain current as transistor 540.

A reference voltage, $V_{REF2}$, is generated at the node between resistor 552 and current source 556 as:

$$V_{REF2}=V_{G2}+I_{BIAS2}*R2$$

When $V_R$ is equal to $V_{T0}$ as described above, this simplifies to:

$$V_{REF2}=V_{T2}+I_{BIAS2}*R2$$

Temperature compensation resistor 552 may be implemented in any manner that provides a nonzero temperature coefficient. For example, in some embodiments, resistor 552 is an N-well transistor fabricated on a semiconductor die. In some embodiments, temperature compensation resistor 552 has a positive temperature coefficient, meaning that the resistance value R2 increases as the temperature increases. Since $V_{REF2}$ is positively biased by $I_{BIAS2}$*R2, the output voltage $V_{REF2}$ also increases as the temperature increases. The value of R2 and $I_{BIAS2}$ are chosen such that the increase in $V_{REF2}$ as a function of temperature closely follows the increase in $V_T$ of memory cells (see FIG. 3) as a function of temperature. When values for R2 and $I_{BIAS2}$ are carefully chosen, the size of the read window can be preserved over temperature.

P-channel source-followers may be advantageously used to pull down the output node much faster when the initial voltage is higher than the nominal voltage. With the gate voltage fixed, the initial source-to-gate voltage of the source follower transistor will be lower than its nominal value and it can pull down the output voltage very strongly to the nominal value.

Either temperature compensated wordline voltage supply circuit 400 (FIG. 4) or 500 (FIG. 5) may be used in memory 200 (FIG. 2) as wordline voltage supply circuit 230. By utilizing a temperature compensated wordline, the read window size can be preserved over temperature.

In some embodiments, multiple temperature compensated wordline voltage supply circuits may be used. For example, in multilevel cell (MLC) embodiments, discussed below, multiple temperature compensated wordline voltage supply circuits with both pull-up and pull-down output circuits may be utilized.

Figure 6:
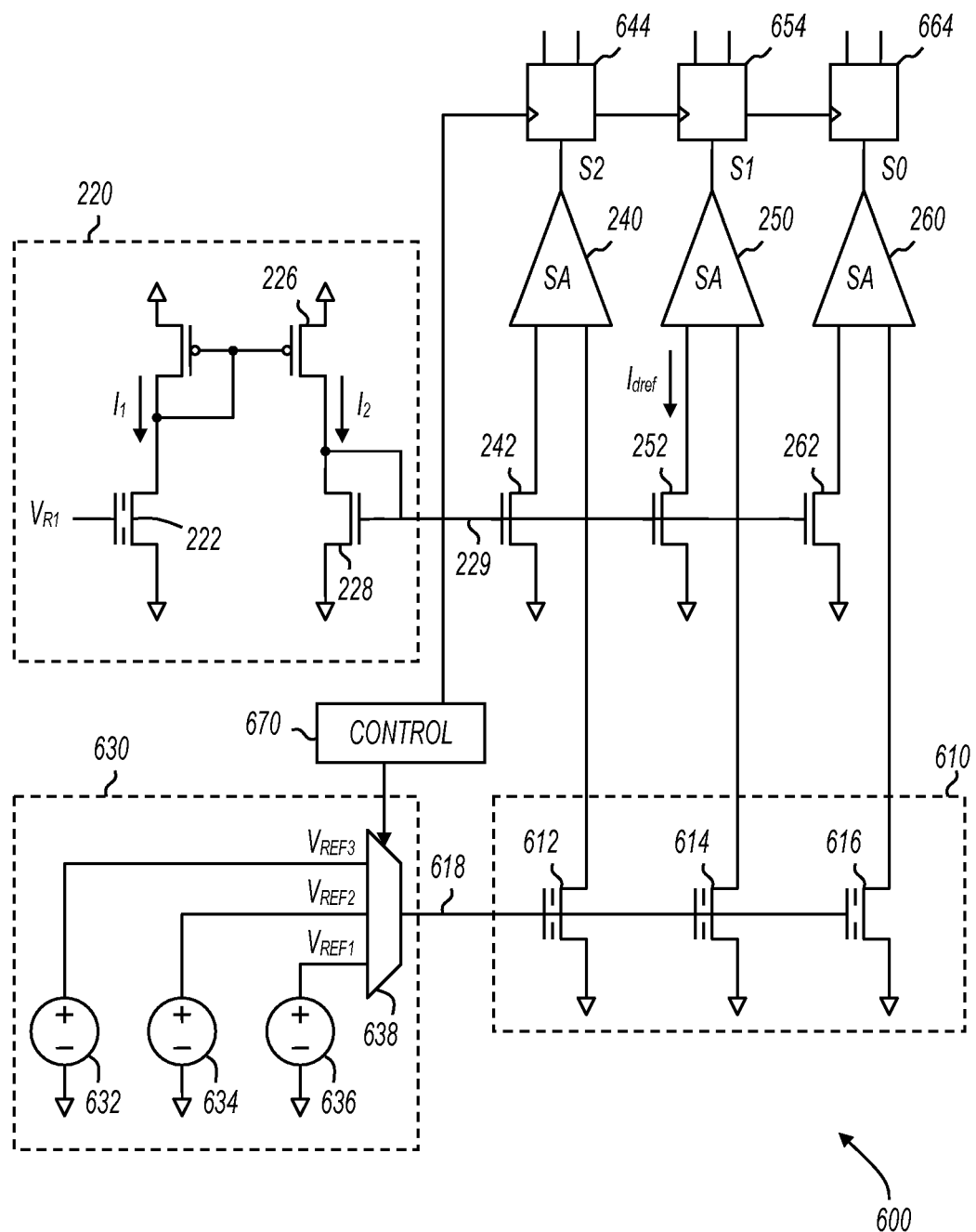
FIG. 6 shows a diagram of a multilevel cell (MLC) nonvolatile memory that includes multiple temperature compensated wordline voltage supply circuit in accordance with some embodiments.

FIG. 6 shows a diagram of a multilevel cell (MLC) nonvolatile memory that includes multiple temperature compensated wordline voltage supply circuits in accordance with some embodiments. Memory device 600 includes reference current generator 220, sense amplifiers 240, 250, and 260, and current mirror transistors 242, 252, and 262, all of which are described above with reference to FIG. 2. Memory device 600 also includes memory array 210, temperature compensated stepped voltage generator 630, latches 644, 654, and 664, and control circuit 670.

Memory array 610 is shown including multi-level cell transistors 612, 614, and 616 having gate nodes coupled to wordline 618. Transistors 612, 614, and 616 are transistors capable of storing multiple bits of information each by being "programmed" to have different threshold voltages $V_T$. For example, each of transistors 612, 614, and 616 may be flash cells that have floating gates capable of storing charge. The threshold voltage of a programmed transistor depends in part on the amount of charge stored on the floating gate. By varying the amount of charged stored, transistors 612, 614, and 616 may be programmed to one of many different levels. For example, transistors 612, 614, and 616 may each be programmed to one of four levels to effectively store two bits of information in each memory cell. Although this description focuses on embodiments in which each multi-level cell is programmed to one of four levels, the various embodiments of the invention are not so limited. For example, in some embodiments of the present invention, each multi-level cell may be programmed to one of eight levels or one of 16 levels.

For simplicity, FIG. 6 shows one row of cells in the array 610. In some embodiments, the array includes many rows and columns of cells. Further, in some embodiments, arrays are arranged in blocks, and many blocks are included within memory device 600. Memory device 600 may be any size with any hierarchical arrangement without departing from the scope of the present invention.

In operation, the various embodiments of the present invention provide an accurate sensing scheme for the multi-level cells in array 610. The cell state is determined by performing multiple comparisons of the cell drain current to a fixed reference current where the cell gate voltage is varied for each comparison. For an N-state memory, N−1 comparisons with N−1 wordline voltage values are used to uniquely determine the cell state.

Stepped voltage generator 630 sources the N−1 gate voltage values, where N is equal to 4. The N−1 gate voltage values are generated using temperature compensated wordline voltage supply circuits 632, 634, and 636. A timing control circuit 670 generates control signals to control multiplexer 638. Multiplexer 638 selects one of the N−1 wordline voltage values to be applied to the wordline. In some embodiments, the wordline voltage sequences from high values to low values (step down). In other embodiments, the wordline voltage sequences from low to high (step up). In still further embodiments, the sequence of wordline voltages is arbitrary. For example, for a multi-level cell having four possible states, the gate may be driven with three voltage values in sequence starting with the center value, then proceeding to the low value, and then the high value.

Temperature compensated wordline voltage supply circuits 632, 634, and 636 can be any of the embodiments described herein or their equivalents. For example, in some embodiments, one of the voltage supply circuits may be a pull-up circuit such as circuit 500 (FIG. 5), and two may be pull-down circuits such as circuit 400 (FIG. 4).

Sense amplifiers 240, 250, and 260 are used to compare currents in array cells to the reference current. For example, sense amplifier 240 compares a drain current in transistor 612 to a drain current in transistor 242. The output of the sense amplifier is a digital signal representing the result of the comparison. This comparison result is converted to a binary representation of the cell state by logically combining the comparison result with one or more control signals from control circuit 670. Various methods can be used to perform this state determination. In some embodiments, one or several latches are coupled to each amplifier to latch the state value. An example embodiment is shown in FIG. 6 with latches 644, 654, and 664 receiving a clock signal from control circuit 670, and the output from the associated sense amplifier. As shown in FIG. 6, multiple sense amplifiers are included, where each sense amplifier is connected to a unique bitline. This allows many cells to be read simultaneously to increase the data throughput. All cells being read simultaneously receive a common wordline voltage applied through the wordline.

For program and erase operations, it may be desirable to position the cell levels halfway between the state boundaries used for read. This provides high reliability for subsequent read operations. This state positioning may be accomplished by incorporating a special read mode, called verify mode, into the program and erase operations. This mode is used to verify that the cell state is correctly positioned. The verify mode gate voltage values are intentionally offset from the read mode voltages to achieve the desired state positioning. It may also be desirable for verify mode to use the same gate voltage timing and sequence as used during read mode so that transient offsets in the gate path will be common to both verify and read, thus being cancelled.

Figure 7:
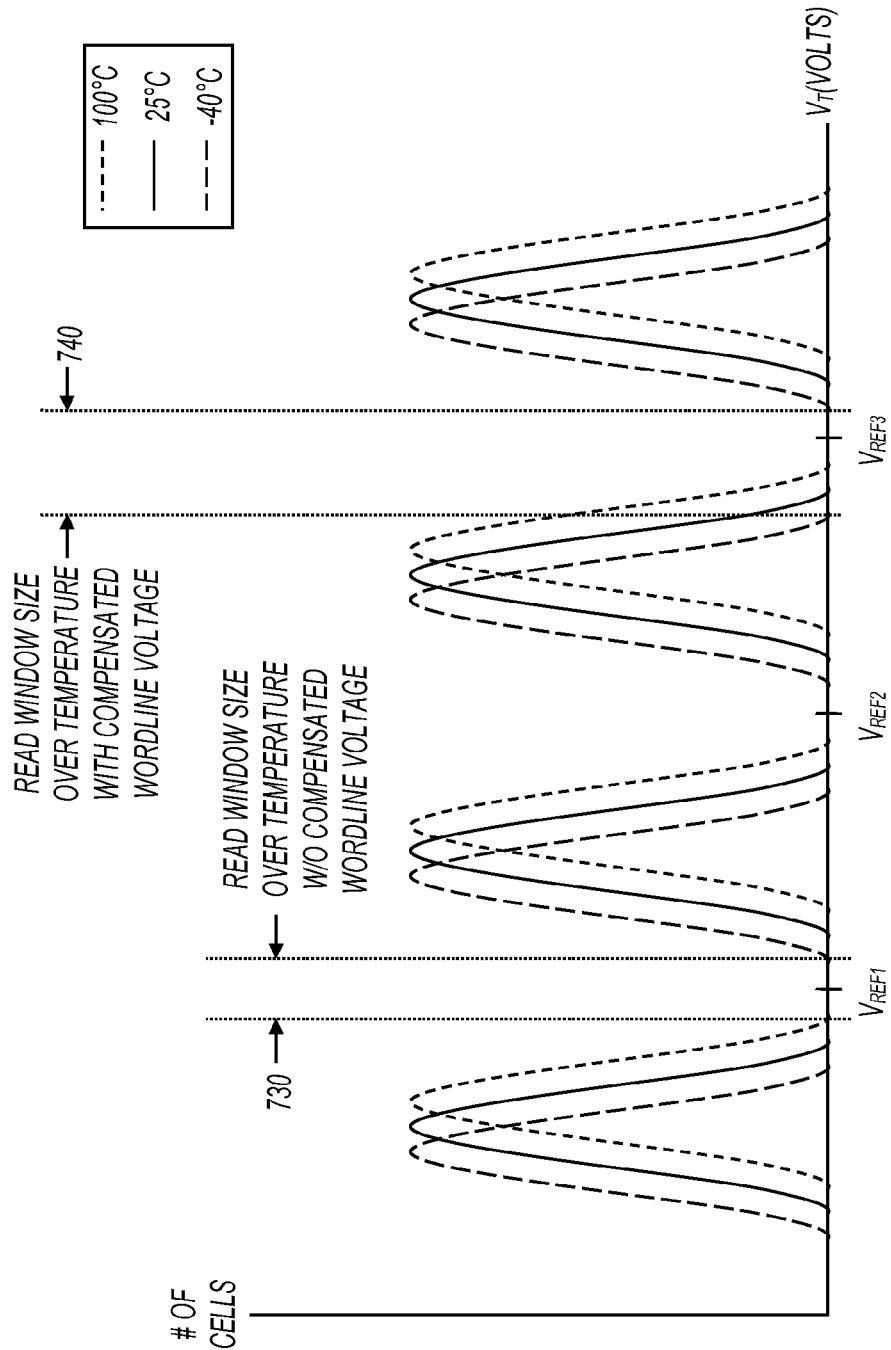
FIG. 7 shows a graph illustrating a read window temperature dependence of the nonvolatile memory of FIG. 6.

FIG. 7 shows a graph illustrating a read window temperature dependence of the nonvolatile memory of FIG. 6. As described above with reference to FIG. 6, each memory cell transistor stores information as charge on a floating gate. The resulting threshold voltages of the transistors can be represented by a quad-modal distribution as shown in FIG. 7. The four modes of the distribution correspond to the four possible states of the memory cell used to store two bits of information. During a read operation, wordline voltages having nominal values of $V_{REF1}$, $V_{REF2}$, and $V_{REF3}$ are presented on the gates of memory cell transistors. Based on the resulting drain current, a cell is determined to be in one of the four states.

The "read window" defines a range of wordline voltages that can be used to distinguish between any two $V_T$ distributions. For example, read window 740 shows wordline voltages capable of distinguishing between the two rightmost $V_T$ distributions at −40 degrees Centigrade.

FIG. 7. also shows how the $V_T$ distributions can shift over temperature. When the temperature rises, the distributions shift to the right because threshold voltages increase. When the temperature drops, the distributions shift to the left because the threshold voltages decrease. As shown at 730, the read window shrinks if the memory is to be operated over a wide temperature range without temperature compensated wordline voltages.

Various embodiments of the present invention provide temperature compensated wordline voltage supply circuits, such that the wordline voltages used for read operations change as a function of temperature similar to the way in which the $V_T$ distributions change as a function of temperature. Examples of temperature compensated wordline voltage supply circuits are shown in FIGS. 4 and 5.

Figure 8:
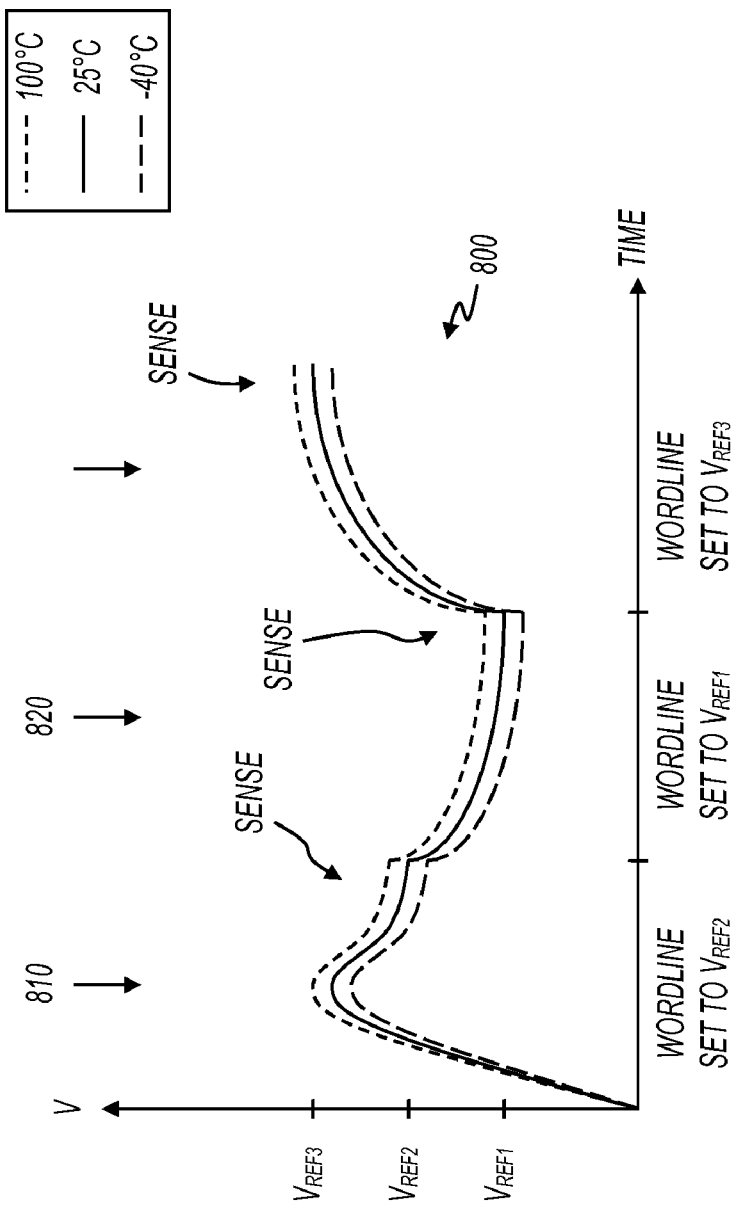
FIG. 8 shows temperature compensated wordline voltage waveforms.

FIG. 8 shows temperature compensated wordline voltage waveforms. Spiral voltage waveform 800 steps first to an intermediate voltage $V_{REF2}$, then to a lower voltage $V_{REF1}$, and then to a higher voltage $V_{REF3}$. Spiral voltage waveform 800 may be generated by a temperature compensated stepped voltage generator 630 (FIG. 6). For example, at 810, spiral voltage waveform 800 corresponds to a multiplexer 638 (FIG. 6) selecting the voltage $V_{REF2}$ to be output; at 820, spiral voltage waveform 800 corresponds to multiplexer 638 selecting the voltage $V_{REF1}$ to be output; and at 830, spiral voltage waveform 800 corresponds to a multiplexer selecting the voltage $V_{REF3}$ to be output.

When spiral voltage waveform 800 is used to drive a wordline in a memory for multi-level sensing, a sensing operation may occur as the voltage settles to a pre-determined value within areas 810, 820, and 830. For example, in some embodiments, a sensing operation may take place when the stepped waveform is within a few percent of its final value (e.g., $V_{REF2}$, $V_{REF1}$, or $V_{REF3}$). As described above with reference to FIGS. 4 and 5, the values of $V_{REF3}$, $V_{REF2}$, and $V_{REF1}$ may be trimmed by programming a threshold voltage of a floating gate transistor within each of the closed loop voltage references within the voltage reference generator.

Figure 9:
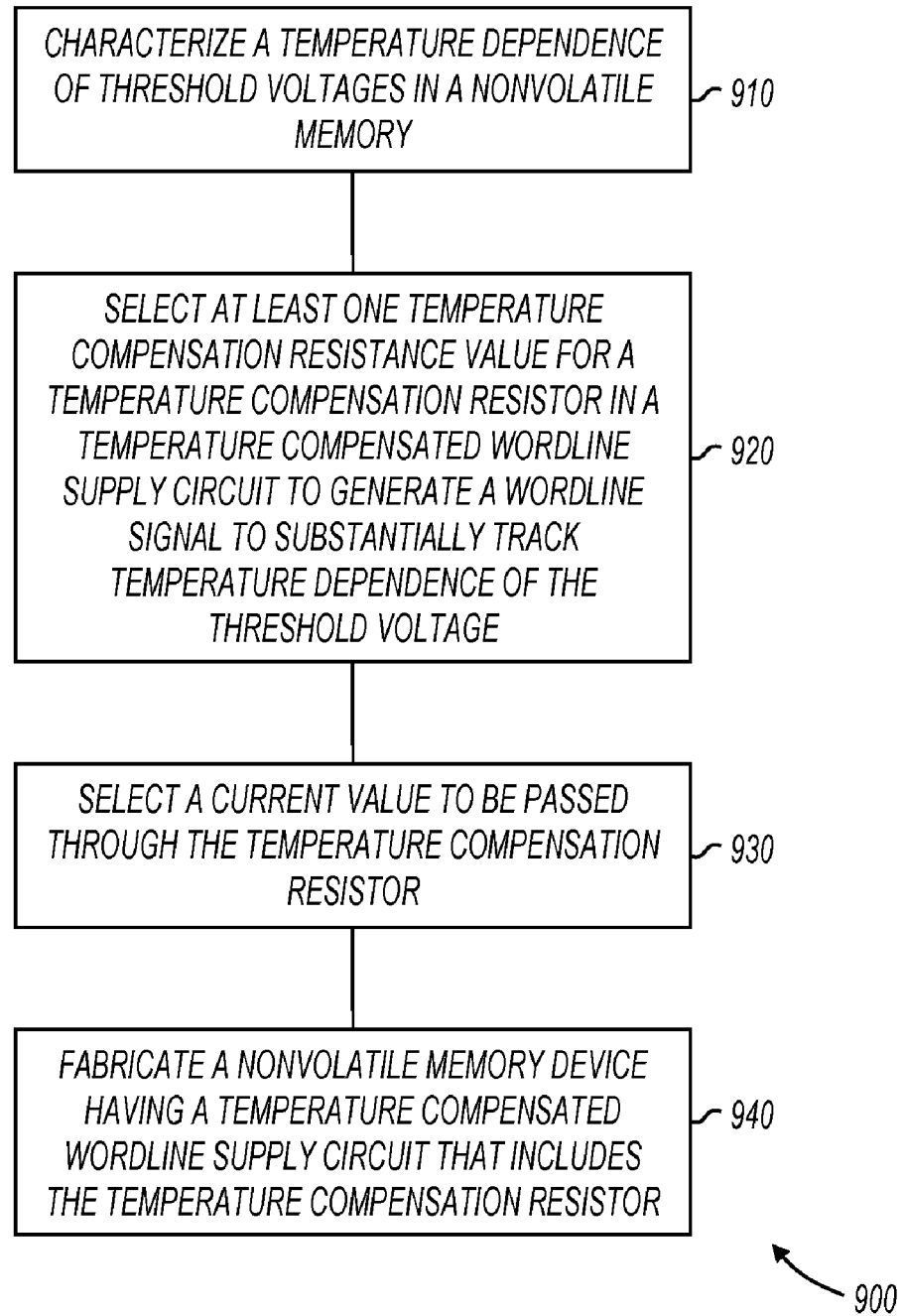
FIG. 9 shows a flow diagram of a method in accordance with some embodiments.

FIG. 9 shows a flow diagram of a method 900 including characterizing a temperature dependence and selecting at least one temperature compensation resistance value for a temperature compensation resistor in accordance with some embodiments. At 910, method 900 includes characterizing a temperature dependence of threshold voltages in a nonvolatile memory. For example, the temperature dependence may be characterized by measuring and recording or plotting threshold voltages of flash memory cells in a nonvolatile memory as a function of temperature. At 920, the method 900 includes selecting at least one temperature compensation resistance value for a temperature compensation resistor in a temperature compensated wordline voltage supply circuit to generate a wordline signal to substantially track the temperature dependence of the threshold voltages. For example, referring to FIG. 4, the temperature compensation resistance value R1 may be selected to generate the wordline signal $V_{REF1}$ on node 452. Also for example, referring to FIG. 5, the temperature compensation resistance value R2 may be selected to generate the wordline signal $V_{REF2}$ on node 554.

At 930 a current value to be passed through the temperature compensation resistor is selected. For example, referring to FIG. 4, the current value $I_{BIAS1}$ to be sourced by current source 446 may be selected. Also for example, referring to FIG. 5, the current value $I_{BIAS2}$ to be sourced by current source 546 may be selected. At 940 a nonvolatile memory device is fabricated that includes a temperature compensated wordline voltage supply circuit that in turn includes the temperature compensation resistor. During operation of the resulting memory device, an offset voltage is generated by $I_{BIAS1}*R1$ and/or $I_{BIAS2}*R2$ and this offset voltage provides temperature compensation as R1 and/or R2 changes with temperature.

In some embodiments, the method 900 is performed, for example, in the design of system 100 (FIG. 1), memory device 200 (FIG. 2) or memory device 600 (FIG. 6). Those skilled in the art will appreciate that the method 900 is not limited to the design of a particular system or memory. Exemplary systems to which the method may be applied include computer systems, communication systems, and information storage systems. A nonvolatile memory, such as a NOR memory, is an exemplary memory device suitable for use in connection with the method 900.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A system comprising:
a processor; and
a nonvolatile memory coupled to the processor, the nonvolatile memory having a floating gate transistor with a temperature dependent threshold voltage, and a temperature compensated wordline voltage supply circuit coupled to provide a wordline signal to the floating gate transistor, wherein the temperature compensated wordline voltage supply circuit includes a resistor with a temperature dependent resistance value, wherein the nonvolatile memory comprises a multi-level cell (MLC) memory, and the temperature compensated wordline voltage supply circuit comprises a first voltage reference circuit to pull-up the wordline signal to a first wordline voltage, and a second voltage reference circuit to pull-down the wordline signal to a second wordline voltage, and wherein the second voltage reference circuit includes a temperature compensated output circuit with a source follower transistor, a current source, and the resistor with the temperature dependent resistance value.

2. The system of claim 1 further comprising a communications transceiver coupled to the processor.

3. The system of claim 1 wherein the nonvolatile memory comprises a NOR flash memory.

4. A memory device comprising:
a nonvolatile memory cell including a floating gate transistor having a threshold voltage; and
a temperature compensated wordline voltage supply circuit to provide a wordline signal to the floating gate transistor, the temperature compensated wordline voltage supply circuit including:
a temperature compensation resistor having a positive temperature coefficient;
a current source to source a substantially constant current to the temperature compensation resistor; and
a programmable flash cell, and the current source and the temperature compensation resistor are coupled in a feedback loop with the programmable flash cell.

5. The memory device of claim 4 wherein the temperature compensated wordline voltage supply circuit includes a pull-up open loop output circuit to provide the wordline signal.

6. The memory device of claim 4 wherein the temperature compensated wordline voltage supply circuit includes a pull-down output circuit to provide the wordline signal, wherein the temperature compensation resistor and the current source are included in the pull-down output circuit.

7. The memory device of claim 4 wherein the floating gate transistor forms a multilevel memory cell (MLC).

8. A voltage reference circuit comprising:
a first flash cell to receive a reference voltage and to produce a threshold voltage current;
a second flash cell having a threshold voltage programmed to be substantially equal to a desired output voltage of the voltage reference circuit, the second flash cell being coupled to the first flash cell through a current mirror to allow the threshold voltage current to flow as a drain current in the second flash cell;
a source follower feedback circuit including a first source follower transistor, a current source, and a temperature compensation resistor coupled between the current source and a drain node of the first source follower transistor, the first source follower transistor having a gate node coupled to a drain node of the second flash cell, and a gate node of the second flash cell coupled to a node common to the temperature compensation resistor and the current source; and
a source follower output circuit including a second source follower transistor with a gate node coupled in common with the gate node of the first source follower transistor.

9. The voltage reference circuit of claim 8 wherein the first and second source follower transistors are p-channel metal oxide semiconductor field effect transistors.

10. The memory device of claim 9 wherein the source follower output circuit comprises a pull-up circuit.

11. The memory device of claim 8 wherein the temperature compensation resistor has a positive temperature coefficient.

12. The voltage reference circuit of claim 11 wherein the current source sources a current through the temperature compensation resistor, and a voltage across the temperature compensation resistor changes with temperature to change the wordline voltage with temperature.

* * * * *